United States Patent [19]
Togai et al.

[11] Patent Number: 5,381,768
[45] Date of Patent: Jan. 17, 1995

[54] AIR-FUEL RATIO CONTROL APPARATUS OF AN INTERNAL COMBUSTION ENGINE

[75] Inventors: Kazuhide Togai, Osaka; Katsunori Ueda, Kyoto, both of Japan

[73] Assignee: Mitsubishi Jidosha Kogyo Kabushiki Kaisha, Tokyo, Japan

[21] Appl. No.: 209,490

[22] PCT Filed: Mar. 14, 1994

Related U.S. Application Data

[63] Continuation of Ser. No. 987,284, filed as PCT/JP92/00918, Jul. 17, 1992, abandoned.

[30] Foreign Application Priority Data

Jul. 18, 1991 [JP] Japan ................ 3-178461

[51] Int. Cl.$^6$ ..................... F02D 41/16; F02M 23/06
[52] U.S. Cl. .............................. 123/339; 123/585
[58] Field of Search .............. 123/339, 585, 587

[56] References Cited

U.S. PATENT DOCUMENTS

| | | | |
|---|---|---|---|
| 4,617,890 | 10/1986 | Kobayashi et al. | 123/585 X |
| 4,700,676 | 10/1987 | Harashima et al. | 123/585 X |
| 4,700,679 | 10/1987 | Otobe et al. | 123/585 X |
| 4,721,082 | 1/1988 | Hibino et al. | 123/585 X |
| 4,873,955 | 10/1989 | McAuliffe, Jr. | 123/339 |
| 4,986,236 | 1/1991 | Kobayashi | 123/339 |
| 5,035,217 | 7/1991 | Kako | 123/339 |
| 5,170,761 | 12/1992 | Kato et al. | 123/339 |
| 5,172,674 | 12/1992 | Horie et al. | 123/585 X |

FOREIGN PATENT DOCUMENTS

| | | |
|---|---|---|
| 60-187724 | 9/1985 | Japan . |
| 62-218632 | 9/1987 | Japan . |
| 63-50641 | 3/1988 | Japan . |
| 2267340 | 1/1990 | Japan . |
| 2176318 | 12/1986 | United Kingdom . |
| 2181574 | 4/1987 | United Kingdom . |

*Primary Examiner*—Willis R. Wolfe

[57] ABSTRACT

An air-fuel ratio control apparatus capable of preventing production of a torque shock which is liable to be caused in an engine when the air-fuel ratio is varied for a change between rich combustion and lean combustion. When the engine is in any other operating state than a specific operating state, an electronic control unit of the apparatus subjects a valve, which is disposed in a first bypass line for bypassing a throttle valve to on/off-duty control in accordance with the difference between a target suction air amount necessary for control for a lean air-fuel ration, computed according to a throttle valve opening detected by a throttle sensor, and a suction air amount detected by an airflow sensor, and urges a bypass valve for opening a negative-pressure responsive valve in a second bypass line. As a result, a predetermined amount of air is allowed to be supplied to the engine through the throttle valve and the first and second bypass lines. In the specific operating state, enough air supply through the throttle valve for control for a rich air-fuel ratio is allowed while preventing air supply through the bypass lines.

11 Claims, 7 Drawing Sheets

AIR-FUEL RATIO CONTROL APPARATUS OF AN INTERNAL COMBUSTION ENGINE

This application is a continuation of application Ser. No. 987,284, filed as PCT/JP92/00918, Jul. 17, 1992, now abandoned.

TECHNICAL FIELD

The present invention relates to an air-fuel ratio control apparatus of an internal combustion engine, which causes the engine selectively to effect the so-called lean or rich combustion as required, to thereby improve the exhaust gas characteristics and Fuel cost performance and increase the engine output as required, and more particularly, to an air-fuel ratio control apparatus capable of preventing a sudden change of the engine output which is liable to be caused when the air-fuel ratio is changed for switching between the lean combustion and rich combustion.

BACKGROUND ART

In order to improve the exhaust gas characteristics and fuel cost performance of a motor vehicle, it is known to control the air-fuel ratio of an air-fuel mixture to be supplied to an internal combustion engine, to have a value on the fuel-lean side of a theoretical air-fuel ratio, thereby allowing the engine to be operated in a lean-combustion mode. If the engine is continually operated in the lean-combustion mode, however, the engine output will be insufficient in some specific operating states (e.g., sudden-departure operating state and sudden-acceleration operating state). Conventionally, therefore, the air-fuel ratio is adjusted to the theoretical air-fuel ratio or its near value (hereinafter referred to as near theoretical air-fuel ratio) to effect rich-combustion operation in the specific operating states of the engine.

According to the conventional air-fuel ratio control, however, the amount of fuel supply to the engine sometimes may undergo a sudden change when the air-fuel ratio is changed between the near theoretical air-fuel ratio and an air-fuel ratio on the fuel-lean side thereof, in order to switch the combustion mode between rich combustion and lean combustion. In such a case, the engine output, which depends on the fuel supply amount, thermal efficiency of the engine, etc., changes suddenly. For example, when the accelerator pedal is released from a driver's stepping operation so that an acceleration operating state (one of the specific operating states) is finished, conventional air-fuel ratio control apparatuses operate to reduce the fuel supply amount rapidly, in order to restore the air-fuel ratio to a value on the fuel-lean side. As a result, the engine output lowers suddenly. If the engine output undergoes such a sudden change, a torque shock is caused in the engine, thus retarding the drivability.

Disclosed in Published Unexamined Japanese Patent Application No. 2-267340 is an air-fuel ratio control apparatus which, belonging to the aforementioned conventional apparatuses in a broader sense, is so designed that the fuel supply amount is reduced during the transition to the lean operating state.

DISCLOSURE OF THE INVENTION

The object of the present invention is to provide an air-fuel ratio control apparatus of an internal combustion engine, capable of preventing a disagreeable torque shock which is liable to be caused when the air-fuel ratio is changed between a near theoretical air-fuel ratio value and a value on the fuel-lean side thereof, in order to cause the engine selectively to undergo either rich combustion or lean combustion.

In order to achieve the above object, according to the present invention, there is provided an air-fuel ratio control apparatus of an internal combustion engine, which controls the air-fuel ratio of an air-fuel mixture to be supplied to an engine so that the air-fuel ratio is adjusted to a first air-fuel ratio approximate to a theoretical air-fuel ratio when the engine is in a specific operating state, and that the air-fuel ratio is adjusted to a second air-fuel ratio on the fuel-lean side of the first air-fuel ratio when the engine is in any other operating state than the specific operating state. This air-fuel ratio control apparatus comprises: a main bypass line bypassing a throttle valve in the middle of a suction passage of the engine and having both ends thereof communicated with the suction passage; a sub-bypass line bypassing the throttle valve and having both ends thereof communicated with the suction passage; main valve means for adjusting the amount of air sucked in through the main bypass line; sub-valve means for adjusting the amount of air sucked in through the sub-bypass line; and control means adapted to control the drive of the main valve means so that the suction air supply through the main bypass line is prevented when the engine is in the specific operating state, and to control the drive of the main valve means and the sub-valve means so that an amount of suction air such that the second air-fuel ratio can be attained is supplied through the main bypass line and the sub-bypass line when the engine is in any other operating state than the specific operating state.

Preferably, the air-fuel ratio control apparatus comprises fuel supply means for adjusting the amount of a fuel to be supplied to the engine. The control means controls the drive of the fuel supply means so that the first air-fuel ratio is attained on the basis of the amount of the suction air supplied through the suction passage not including at least the main bypass line and the amount of the fuel supplied from the fuel supply means when the engine is in the specific operating state. Further, the control means controls the drive of the fuel supply means so that the second air-fuel ratio is attained on the basis of the amount of the suction air supplied through the suction passage including the main and sub-bypass lines and the amount of the fuel supplied from the fuel supply means when the engine is in any other operating state than the specific operating state. Furthermore, the control means controls the drive of the main valve means and the sub-valve means in order to change the suction air amount lest an output which can be practically fetched from the engine while the operation mode is switched from operation with the first air-fuel ratio to operation with the second air-fuel ratio be subject to any substantial change.

Preferably, the main valve means is formed of a negative-pressure responsive valve adapted to operate in response to a negative pressure inside the suction passage varying depending on the opening of the throttle valve. The control means prevents the negative pressure supply to the negative-pressure responsive valve when the engine is in the specific operating state, and allows the negative pressure supply to the negative-pressure responsive valve when the engine is in any other operating state than the specific operating state.

Preferably, the air-fuel ratio control apparatus further comprises load parameter detecting means for detecting the value of a parameter indicative of a load acting on the engine. The control means subjects the valve opening of the sub-valve means to open-loop control in accordance with the engine load. The sub-valve means is formed of a motor-operated valve including, for example, a stepping motor and having a valve opening corresponding to the rotational position of the motor. The control means subjects the rotational position of the stepping motor to open-loop control.

Alternatively, the air-fuel ratio control apparatus further comprises load parameter detecting means for detecting the value of a parameter indicative of a load acting on the engine, e.g., throttle opening detecting means for detecting the throttle opening, and air amount detecting means for detecting the amount of air sucked in through the suction passage. The control means computes a target suction air amount such that the second air-fuel ratio can be attained, in accordance with the detected engine load parameter value, e.g., the detected throttle valve opening, when the engine is in any other operating state than the specific operating state, and then controls the valve opening of the sub-valve means in accordance with the difference between the detected actual suction air amount and the target suction air amount. The sub-valve means is formed of, e.g., a solenoid-operated on-off valve, and the control means controls an on-off duty ratio, that is, the time-based average valve opening, of the solenoid-operated on-off valve.

According to the present invention, as described above, the main and sub-bypass lines arranged in the suction passage, bypassing the throttle valve, are provided, respectively, with the main and sub-valve means for adjusting the amount of air sucked in through the two bypass lines, the suction air supply through the main bypass line is prevented when the engine is in the specific operating state, and an amount of suction air such that the second air-fuel ratio can be attained is supplied through the main and sub-bypass lines when the engine is in any other operating state than the specific operating state. Accordingly, the suction air amount is increased so that the second air-fuel ratio can be attained during the transition from the specific operating state to any other operating state. Thus, the fuel supply amount can be prevented from being rapidly reduced during the aforesaid transition, so that a torque shock can be prevented from being caused by a sudden change of the engine output torque. Since the two bypass lines are used for the increase of the suction air amount, moreover, the valve means in each bypass line may be of a small capacity, so that the cost can be reduced. If the valve means is formed of a solenoid valve, furthermore, a small-sized battery can be used for the drive of the solenoid valve.

Preferably, the drive of the fuel supply means is controlled so that the first air-fuel ratio is attained on the basis of the amount of the suction air supplied through the suction passage and the amount of the fuel supplied from the fuel supply means when the engine is in the specific operating state, and the fuel supply is controlled so that the second air-fuel ratio is attained on the basis of the suction air amount and the fuel supply amount when the engine is in any other operating state than the specific operating state. Thus, the first or second air-fuel ratio can be attained as required in various engine operation regions. Also, the change of the suction air amount is controlled lest the engine output be subject to any substantial change during the transition between rich-combustion operation and lean-combustion operation. Thus, when the air-fuel ratio is changed for the aforesaid transition, the continuity of the engine output torque can be maintained, so that a torque shock can be prevented from being caused in the engine. It is not essential, moreover, to change the air-fuel ratio gradually between the first and second air-fuel ratios, in order to prevent the torque shock during the transition between the rich-combustion operation and the lean-combustion operation. In contrast with the case where the air-fuel ratio is gradually changed, therefore, the engine need not be operated in an operation region such that the exhaust gas purification factor worsens, so that the exhaust gas characteristics are improved.

Preferably, the main valve means is formed of a negative-pressure responsive valve adapted to operate in response to a negative pressure inside the suction passage varying depending on the opening of the throttle valve. In this case, the suction air amount can be roughly controlled by means of the main valve means formed of the negative-pressure responsive valve, and precise suction air amount control can be effected by means of the sub-valve means. Thus, sub-valve means of a small capacity is available for the purpose.

Preferably, the valve opening of the sub-valve means is subjected to the open-loop control in accordance with the engine load, so that it is unnecessary to use a sensor for suction air amount detection, which is essential to the case where the suction air amount is feedback-controlled, and the suction air amount control can be carried out with ease. When feedback-controlling the suction air amount, on the other hand, the suction air amount can be controlled precisely.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

PREFERRED EMBODIMENTS OF THE INVENTION

Figure 1:
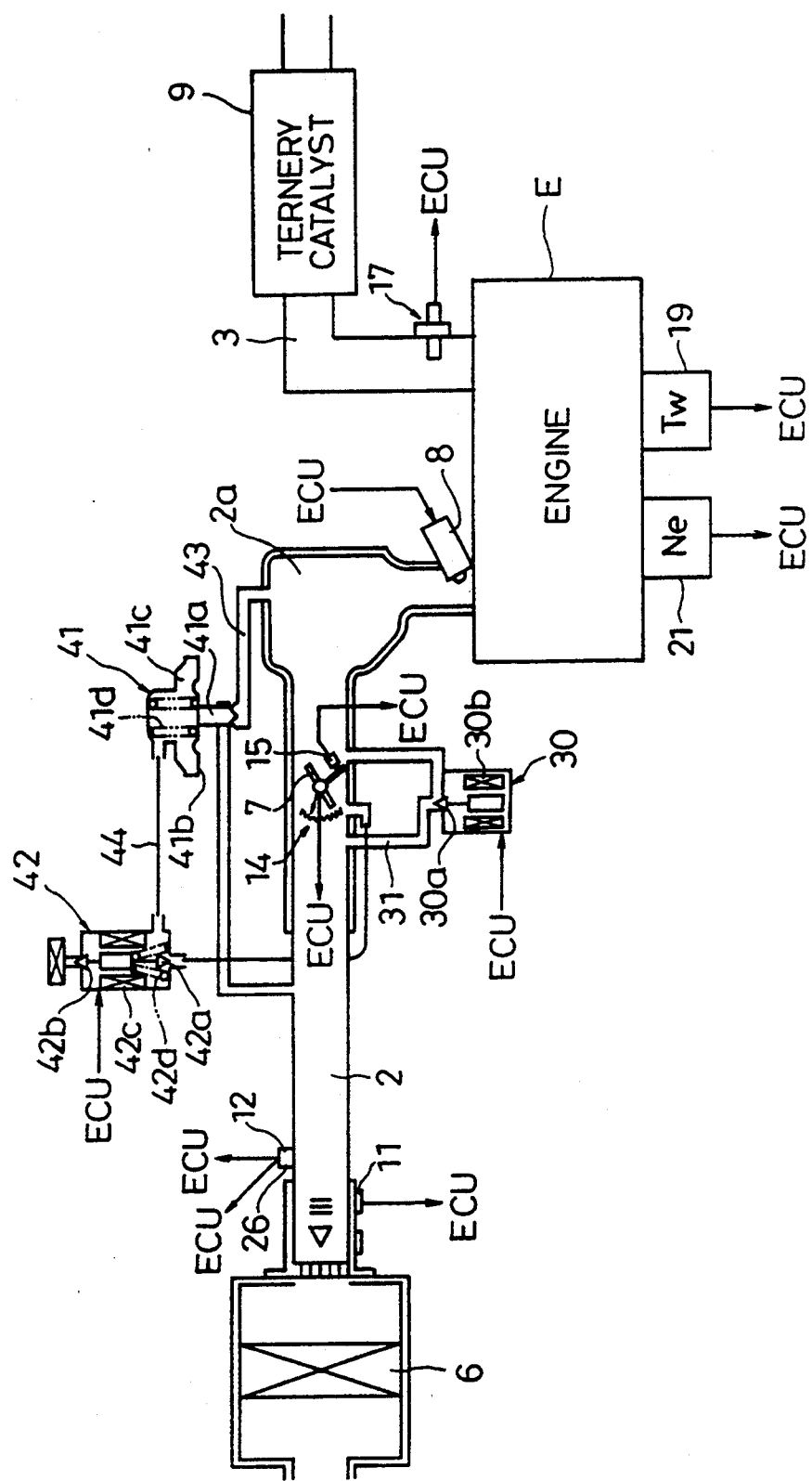
FIG. 1 is a schematic view showing an air-fuel ratio control apparatus according to a first embodiment of the present invention along with its peripheral elements.

Referring to FIG. 1, symbol E designates a gasoline engine which is used with an air-fuel ratio control apparatus (mentioned later) according to a first embodiment of the present invention. A suction passage 2 and an exhaust passage 3 are connected individually to the respective combustion chambers (not shown) of individual cylinders of the engine E. The suction passage 2 and each combustion chamber are connected to and disconnected from each other by means of a suction valve (not shown) which is interposed between them. Likewise, the exhaust passage 3 and each combustion chamber are connected to and disconnected from each other by means of an exhaust valve (not shown) which is interposed between them.

The suction passage 2 is provided with an air cleaner 6, a throttle valve 7, and fuel injection valves 8, which are successively arranged from the upper-course side. The fuel injection valves 8, which are as many as the cylinders, are arranged at a suction manifold portion. Reference numeral 2a denotes a surge tank 2a which is located on the lower-course side of the suction passage 2 with respect to the throttle valve. On the other hand, the exhaust passage 3 is provided with a catalyst converter (ternary catalyst) 9 for exhaust gas purification and a muffler (not shown), which are successively arranged from the upper-course side.

Further, the suction passage 2 is provided with two bypass lines 31 and 43 for use as components of the air-fuel ratio control apparatus, bypassing the throttle valve 7. Both ends of each bypass line communicate with the suction passage 2.

The first bypass line 31 as a sub-bypass line is provided with an ISC valve (a sub-valve unit) 30 for adjusting the amount of suction air supplied through the bypass line 31. The ISC valve 30 of the present embodiment is formed of a solenoid valve which includes a valve plug 30a, a solenoid 30b for driving the valve plug 30a in opening and closing directions and the like. The solenoid 30b of the ISC valve 30 is connected to an electronic control unit (ECU), which is denoted by reference numeral 23 in FIG. 2 and will be described in detail later. The ISC valve 30 is subjected to on/off-duty control in response to a driving signal from the ECU 23 so that the time-based average valve opening of this valve is variably controlled. Thus, a required amount of bypass air is supplied to the engine E through the first bypass line 31. The ISC valve 30 is used for idling engine speed control and the like, as well as for the air-fuel ratio control.

On the other hand, the second bypass line 43 as a main bypass line is provided with a negative-pressure responsive valve (ACV valve) 41. The lift of the negative-pressure responsive valve 41 varies depending on the negative pressure inside the suction passage 2, which changes according to the throttle valve opening. More specifically, the negative-pressure responsive valve 41 includes a valve plug 41a on a diaphragm for opening and closing the bypass line 43, a pressure chamber 41c defined by the outer wall of the negative-pressure responsive valve 41 and the diaphragm 41b, and a spring 41d disposed in the pressure chamber 41c and always urging the valve plug 41a through the diaphragm 41b in a direction to close the negative-pressure responsive valve 41. The pressure chamber 41c of the negative-pressure responsive valve 41 is communicated, by means of a line 44, with the suction passage 2 in a position just on the upper-course side of the throttle valve 7 where a negative pressure corresponding to the throttle valve opening is produced.

A bypass valve 42, which serves as a negative pressure control valve, is disposed in the middle of the line 44. The bypass valve 42, in conjunction with the negative-pressure responsive valve 41 and the line 44, constitutes a main valve unit for adjusting the amount of intake air supplied through the second bypass line 43. Specifically, the bypass valve 42 includes a valve plug 42a for opening and closing the line 44, a valve plug 42b which operates on unison with the valve plug 42a to open and close an aperture for the atmosphere, a spring 42d always urging the valve plug 42b in a direction to close the bypass valve 42, and a solenoid 42c for driving these valve plugs 42a and 42b in opening and closing directions. The solenoid 42c is connected to the output side of the ECU 23.

Figure 6:
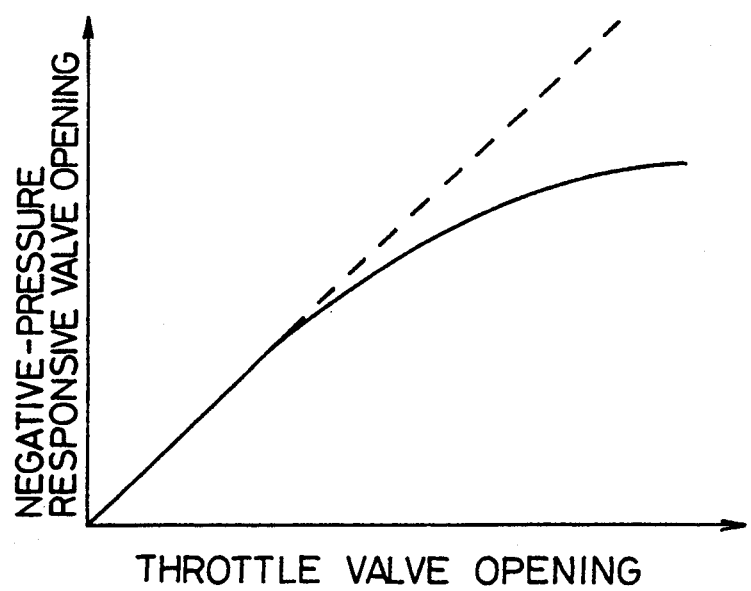
FIG. 6 is a graph illustrating the relationship between the valve opening of the negative-pressure responsive valve and the throttle valve opening, obtained with use of a certain engine speed.

Preferably, the position where that end of the line 44 which opens into the suction passage 2 is formed is so selected that a negative pressure (ACV negative pressure) supplied from the suction passage 2 to the pressure chamber 41c of the negative-pressure responsive valve 41 through the line 44 changes substantially in proportion to the throttle valve opening. If the ACV negative pressure changes accurately in proportion to the throttle valve opening, the valve opening (ACV opening) of the negative-pressure responsive valve 41 changes in proportion to the throttle valve opening, as indicated by broken line in FIG. 6. If the ratio between the throttle valve opening and the sum of the ACV opening and the throttle valve opening is equal to the ratio between a theoretical air-fuel ratio (first air-fuel ratio) and a target air-fuel ratio (second air-fuel ratio) on the fuel-lean side of the theoretical air-fuel ratio, a required one of the first and second air-fuel ratios can be attained by selectively preventing or allowing the supply of suction air through the main bypass line 43.

Actually, however, it is difficult to select a position for the open end of the line which fulfills the requirement such that the ACV negative pressure (ACV opening) and the throttle valve opening are proportional to each other. Typically, the ACV negative pressure changes as indicated by the full line in FIG. 6 as the throttle valve opening varies. More specifically, in the region where the throttle valve opening is large, the ACV opening is smaller than the optimum ACV opening indicated by the broken line in FIG. 6. Thus, the amount of intake air supplied through the second bypass line (the main bypass line) 43 changes substantially following the change of the operating state of the engine. In the region where the throttle valve opening is large, however, the intake air amount is insufficient.

In the main valve unit constructed in this manner, when the solenoid 42e of the bypass valve 42 is de-energized without being supplied with the driving signal from the ECU 23, the valve plug 42a closes the line 44 on the negative pressure generation side, while the valve plug 42b allows the atmosphere aperture to open, so that the atmospheric pressure is led into the pressure chamber 41e of the negative-pressure responsive valve 41. At this time, the spring 41d causes the diaphragm 41b to press the valve plug 41a in the direction to close the bypass line 43, thereby closing the bypass line 43. Accordingly, the supply of the bypass air to the engine E through the bypass line 43 is prevented. When the solenoid 42c is energized by the driving signal from the ECU 23, the valve plug 42b closes the atmosphere aperture, and the line 44 is opened so that the negative pressure inside the suction passage 2 is led into the pressure chamber 41c. As a result, the valve plug 41a is lifted in the valve opening direction, resisting the urging force of the spring 41d, so that the bypass line 43 is opened. Thereupon, the negative pressure, which varies depending on the engine operating state, is led into the pressure chamber 41c, and the lift of the valve plug 41a is determined depending on the negative pressure, so that a required amount of air can be supplied to the engine E through the bypass line 43.

Figure 5:
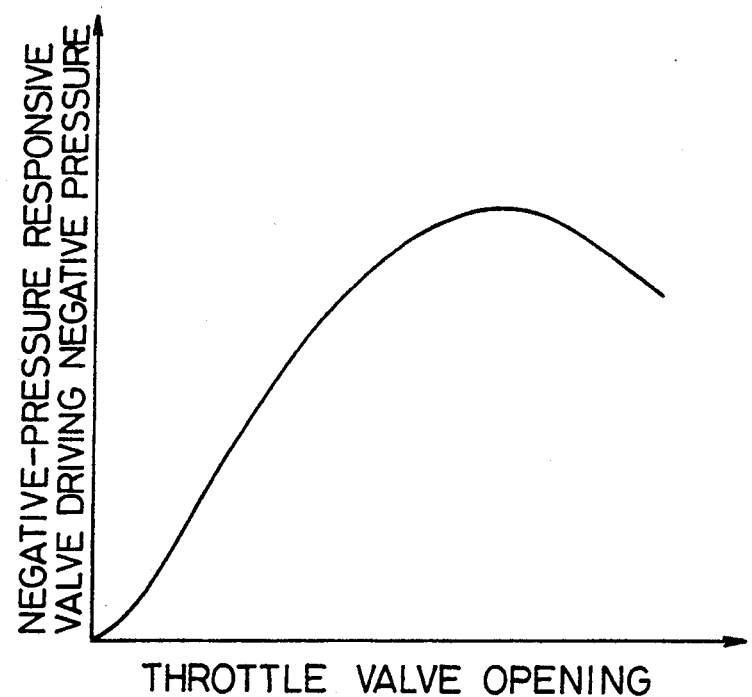
FIG. 5 is a graph illustrating the relationship between the negative pressure supplied to a pressure chamber of a negative-pressure responsive valve shown in FIG. 1 and the throttle valve opening, obtained with use of a certain engine speed.

In carrying out a lean combustion operation, the bypass valve 42 is opened, the bypass air is supplied to the engine E through the bypass line 43, and the ISC valve 30 is duty-controlled so that the bypass air is supplied to the engine E also through the bypass line 31. The amount of bypass air supply through the bypass line 43 is determined depending on the negative pressure inside the suction passage 2, so that the suction air can be supplied substantially corresponding to the operating state of the engine E. As mentioned before with reference to FIGS. 5 and 6, however, it is difficult to accurately supply the suction air to a target amount through the bypass line 43 only. Because the ISC valve 30 is a solenoid valve, on the other hand, it is not practical to use a large-capacity version, in view of cost and battery capacity, and it is not advisable in practice to arrange the apparatus so that the suction air is supplied to the target amount through the bypass line 31 only. According to the present embodiment, therefore, the ISC valve 30 is duty-controlled so that an amount of air for compensating the amount of air supply through the bypass line 43 is supplied to the engine E, whereby the amount of the suction air can be controlled accurately for the target amount.

In performing a rich-combustion operation, on the other hand, the bypass valve 42 is closed to cut off the bypass line 43. Accordingly, the amount of the suction air supplied to the engine E changes depending on the opening of the throttle valve 7 in the suction passage 2. Preferably, the valve opening of the ISC valve 30 is adjusted so that basic auxiliary air corresponding to the operating state of the engine E is supplied to the engine E. This basic auxiliary air is auxiliary air for the so-called "dashpot control," which functions to prevent stalling of the engine attributable to the rapid decrease in the engine speed even when the throttle valve 7 is suddenly closed.

Thus, if the same amount of fuel is supplied to the engine E, then the lean-combustion operation is performed by opening the bypass line 43, and the rich-combustion operation is performed by closing the bypass line 43.

With this arrangement, the suction air supplied through the throttle valve 7 (suction passage 2) alone or through the throttle valve 7 and the first and second bypass lines 31 and 43 is mixed with a fuel from each fuel injection valve 8 in a predetermined air-fuel ratio at the suction manifold portion, and the resulting mixture is burned in each combustion chamber, thereby producing an engine torque. The fuel supplied from a fuel pump to each fuel injection valve 8 is adjusted to a fixed pressure by means of a fuel pressure regulator (not shown).

Further, the following various sensors (FIGS. 1 and 2) are provided in order to execute various engine controls, including the aforesaid air-fuel ratio control and fuel supply control, by means of the electronic control unit (ECU).

First arranged on the side of the suction passage 2 are an airflow sensor 11 for detecting the suction air amount from Karman vortex street information, an atmospheric pressure sensor 26 for detecting the atmospheric pressure, and a suction air temperature sensor 12 for detecting the suction air temperature. Also, the throttle valve 7 in the suction passage 2 is provided with a throttle sensor 14 of a potentiometer type for detecting the throttle valve opening through the valve shaft or the like, an idle switch 15 for detecting the idling state, and the like. Further, an O2 sensor 17 for detecting the oxygen concentration of the exhaust gas is located on the upper-course side of the exhaust passage 3 with respect to the catalyst converter 9. Connected to the input side of the ECU 23, moreover, are the aforesaid sensors 11, 14 and 15, along with a water temperature sensor 19 for detecting the temperature of engine cooling water, an engine speed sensor 21 for detecting an engine speed Ne by detecting the crank angle, and other sensors generally denoted by reference numeral 18 in FIG. 2. Detection signals from these sensors are applied to the input of the ECU 23.

The ECU 23 (not shown in detail) is provided with a processor (CPU) as its principal part, and the signals from the aforesaid various sensors are applied to the input ports of the CPU through suitable input interfaces or directly. Further, the CPU is connected, by means of bus lines, to storage devices, such as a ROM stored with program data and fixed value data, a RAM for storing data in a reloadable manner and a battery backup RAM whose stored contents are retained while the battery is connected, so that data are transferred between the CPU and the storage devices. Also, various control signals from the CPU of the ECU 23 are delivered to the fuel injection valve 8, the ISC valve 30, the bypass valve 42, etc. through suitable output interfaces.

For the fuel supply control during the operation of the engine E, the ECU 23 periodically computes a valve-open period Tinj of the fuel injection valve 8 for each cylinder according to the following equation (1), and supplies the fuel injection valve 8 with a driving signal corresponding to the valve-open period Tinj, so that the fuel in an amount corresponding to the valve-open period Tinj is injected into the suction port of a cylinder to be supplied with the fuel in the present cycle.

$$Tinj = (A/N) \div \lambda \times K1 \times K2 \times + T0, \qquad (1)$$

where A/N is the amount of air sucked into an associated cylinder in one suction stroke. In the present embodiment, the suction air amount A/N is computed by means of the CPU on the basis of a Karman vortex street frequency f detected by means of the airflow sensor 11 and the engine speed Ne detected by means of the engine speed sensor 21. Target suction air amounts $A/N_S$ and $A/N_L$ for the rich- and lean-combustion operations, used in the air-fuel ratio control, which will be further described later, are stored in the form of a map in a built-in storage device of the ECU 23. In the present embodiment the target suction air amounts $A/N_S$ and $A/N_L$ are represented by functions of the throttle valve opening $\theta$ and the engine speed Ne, so that a series of target values $A/N_S$ and another series of target values $A/N_L$, corresponding individually to various combinations of the parameters $\theta$ and Ne, are stored in the form of a map.

In equation (1), X is the target air-fuel ratio, which is adjusted to the theoretical air-fuel ratio or its near value $\lambda_S$ (e.g., 14.7) for the rich-combustion operation, and to a predetermined value $\lambda_L$ (e.g., 22) on the fuel-lean side, with respect to the theoretical air-fuel ratio, for the lean-combustion operation. In the present embodiment, one fixed predetermined value common to the whole lean-combustion operation region is used as the target air-fuel ratio (second air-fuel ratio) $\lambda_L$ for the lean-combustion operation.

Further, K1 is a coefficient for converting a fuel flow rate into a valve-open period, and K2 represents correction factor values which are set in accordance with various parameter values indicative of the engine operating state. The correction factor values K2 include, for example, a water temperature correction factor value set in accordance with an engine water temperature TW detected by means of the engine water temperature sensor 19, an $O_2$ feedback correction factor value set in accordance with the oxygen concentration of the exhaust gas detected by means of the $O_2$ sensor 17, an atmosphere correction factor value set in accordance with an atmospheric pressure Pa detected by means of the atmospheric pressure sensor 26, and the like. T0 is a correction value set in accordance with the battery voltage or the like.

Figure 3:
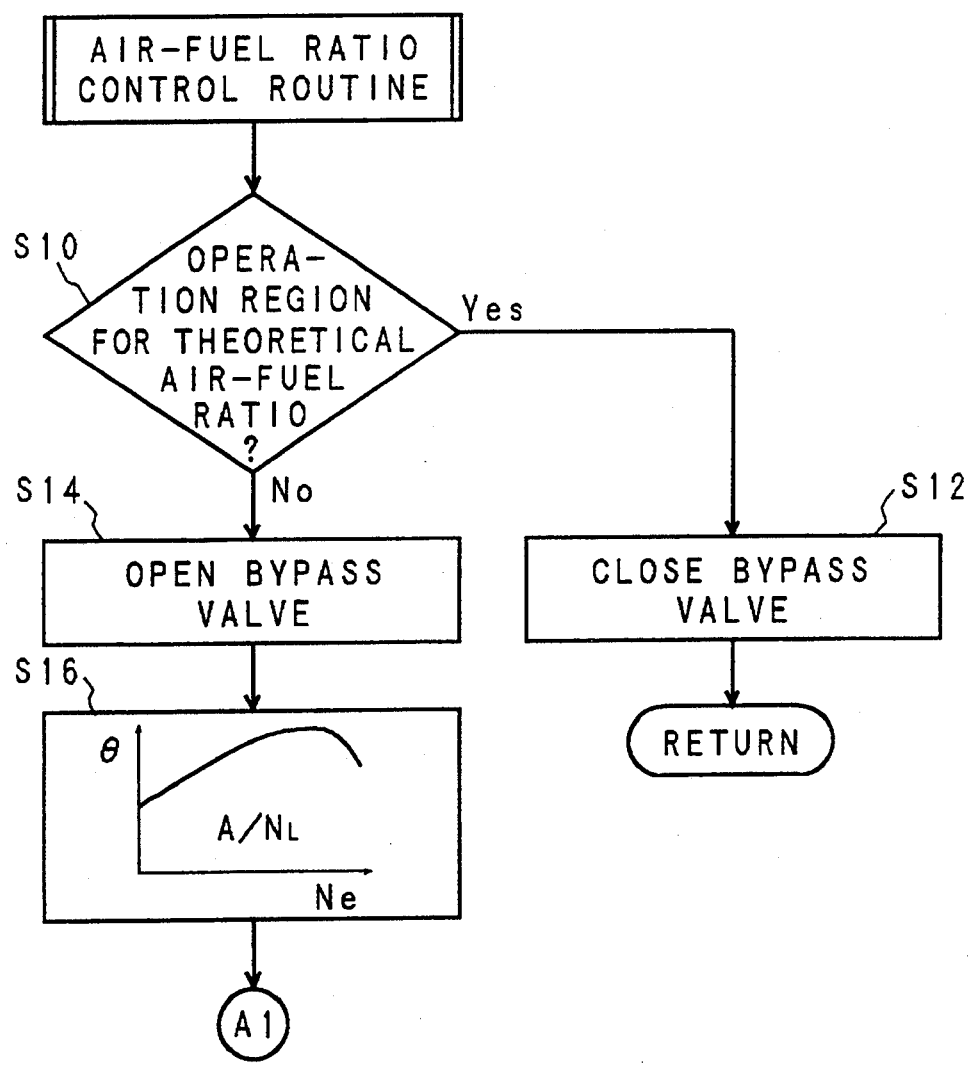
FIG. 3 is a flow chart showing part of an air-fuel ratio control routine executed by means of the electronic control unit shown in FIG. 2.
Figure 4:
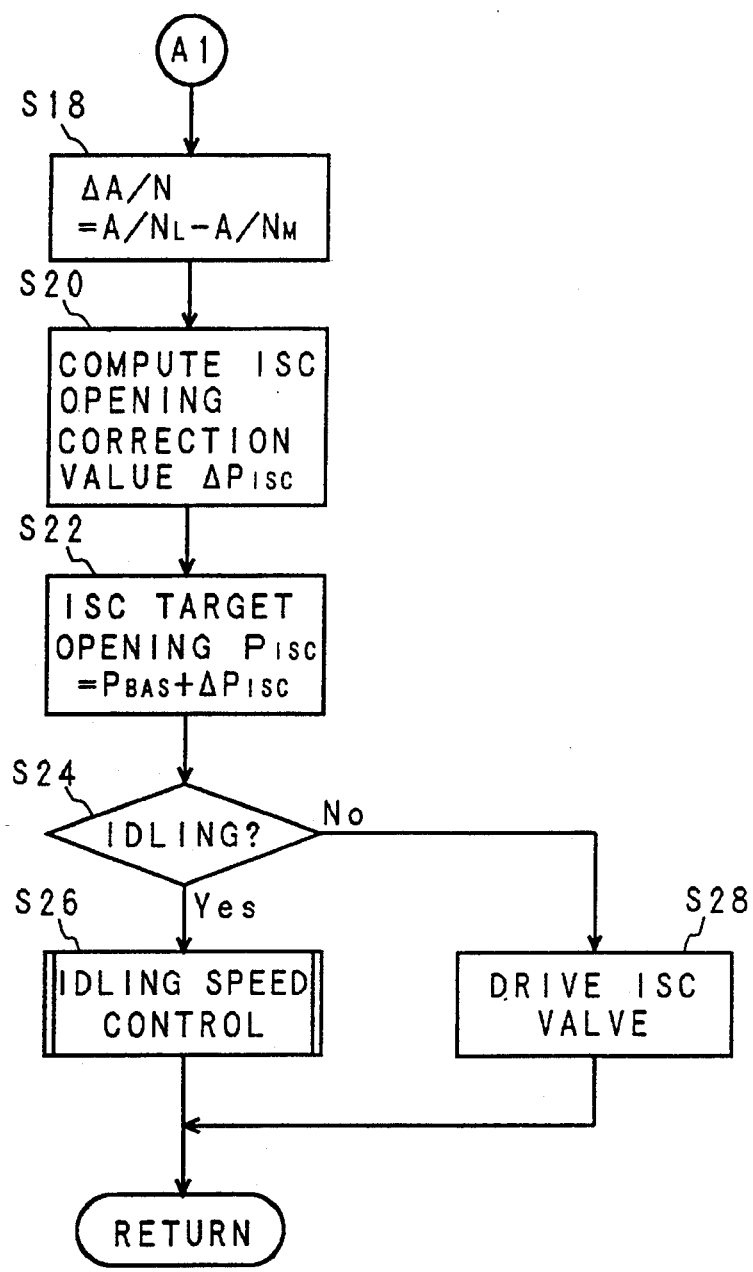
FIG. 4 is a flow chart showing the remainder of the air-fuel ratio control routine.

Referring now to FIGS. 3 and 4, an air-fuel ratio control routine for changing the air-fuel ratio between the rich and lean sides will be described.

The air-fuel ratio control routine is periodically executed by means of the electronic control unit (ECU) 23 in parallel with the aforesaid fuel supply control during the engine operation. In each cycle of the air-fuel ratio control routine, the CPU of the ECU 23 computes change of signals from the throttle sensor 7 on the basis of output signals from the throttle sensor 7 detected individually in the preceding and present cycles, for example. Based on the sensor signal change detected in this manner, it is determined whether or not the engine E is being operated in the region for the theoretical air-fuel ratio operation (rich-combustion operation) including a sudden-departure operating state and sudden-acceleration operating state (Step S10).

If the result of the decision in Step S10 is positive, that is, if it is concluded that the engine E is being operated in the rich-combustion operation region, the CPU stops the supply of the driving signal to the solenoid 42c of the bypass valve 42 (Step S12). As a result, the line 44 is closed by the valve plug 42a of the bypass valve 42 and hence the bypass line 43 is closed by the valve plug 41a of the negative-pressure responsive valve 41, so that the air supply to the engine E through the bypass line 43 is stopped. When the bypass valve 42 is de-energized in this manner, the air-fuel ratio control routine for the present cycle is finished. The amount of the suction air supplied to the engine E during the rich-combustion operation is determined depending on the throttle valve opening, while the amount of fuel supply is obtained according to equation (1). Thus, the rich-combustion operation is performed with use of the theoretical air-fuel ratio (a first air-fuel ratio).

If the result of decision in Step S10 is negative, that is, if it is concluded that the engine E is being operated in the lean-combustion operation region, on the other hand, the CPU of the ECU 23 supplies the driving signal to the solenoid 42c of the bypass valve 42 (Step S14). As a result, the bypass valve 42 is opened to open the line 44, so that the negative pressure inside the suction passage 2 is supplied to the pressure chamber 41c of the negative-pressure responsive valve 41, thereby opening the negative-pressure responsive valve 41, whereby the bypass air is supplied to the engine E through the bypass line 43. Thus, the suction air for the engine E is supplied through the bypass line 43 as well as the throttle valve 7.

Then, based on the throttle valve opening $\theta$ detected by means of the throttle sensor 14 and the engine speed Ne detected by means of the engine speed sensor 21, the CPU reads the target suction air amount $A/N_L$ for the lean-combustion operation, which is fit for the respective values of the parameters $\theta$ and Ne from the map in the storage device (Step S16). Further, the CPU computes an actual suction air amount A/Nm on the basis of the Karman vortex street frequency f detected by means of the airflow sensor 11 and the engine speed Ne detected by means of the engine speed sensor 21, and then obtains a deviation $\Delta A/N$ between the target suction air amount $A/N_L$ read in Step S16 and the actual suction air amount A/Nm (Step S18).

In accordance with the following equation (2), moreover, the CPU computes an opening correction value $\Delta P_{ISC}$ of the ISC valve 30 corresponding to the deviation $\Delta A/N$ (Step S20).

$$\Delta P_{ISC} = K_P \cdot \Delta A/N, \qquad (2)$$

where $K_P$ is a feedback proportional gain, which is fixed to a predetermined value or is variably set depending on the engine speed Ne, for example.

Then, based on the correction value $\Delta P_{ISC}$ computed in Step S20 and a predetermined basic opening $P_{BAS}$ corresponding to the basic auxiliary air amount, the CPU computes an ISC target opening $P_{ISC}$ according to the following equation (3) (Step S22).

$$P_{ISC} = P_{BAS} + \Delta P_{ISC}. \qquad (3)$$

Subsequently, the CPU determines whether or not the engine E is in the idling state (Step S24). IF the engine E is not in the idling state, the CPU sets the duty factor of ISC valve 30 in accordance with the ISC target opening $P_{ISC}$ obtained in Step S22, and delivers a driving signal corresponding to the duty factor to the solenoid 30b of the ISC valve 30 (Step S28). As a result, the ISC valve 30 is subject to on/off-duty control such that the actual suction air amount is adjusted, without being over and short, to the target suction air amount $A/N_L$ to be supplied to the engine E, whereby an amount of air approximate to the target suction air amount $A/N_L$ is supplied to the engine E.

During the lean-combustion operation, as described above, the bypass valve 42 is opened in Step S14, and the ISC valve 30 is subjected to the on/off-duty control in Step S28 so that the time-based average valve opening of the ISC valve 30 is adjusted. In consequence, the amount of the suction air supplied through the bypass lines 43 and 31 is adjusted, so that the lean-combustion operation is effected with use of the predetermined air-fuel ratio $\lambda_L$ on the lean side with respect to the theoretical air-fuel ratio.

If the result of the decision in Step S24 is positive, that is, if it is concluded that the engine E is in the idling state, on the other hand, then conventional idling speed control is executed (Step S26). Since this idling speed control has no special relation to the embodiments of the present invention, its detailed description is omitted.

As seen from the above description, immediately after the operation mode is switched from the lean-combustion operation to the rich-combustion operation, the bypass valve 42 is closed to cut off the bypass line 43, so that the suction air amount A/N is rapidly reduced. Immediately after the transition to the rich-combustion operation, the valve-open period Tinj is computed in accordance with the suction air amount A/N rapidly reduced in this manner, so that the fuel supply amount at the point of time concerned takes a value corresponding to the rapidly reduced suction air amount. As seen from equation (1), if the target air-fuel ratio λ as a variable in this equation undergoes no substantial change while the operation mode is switched to the rich-combustion operation, the fuel supply amount also decreases as the suction air amount decreases. During the transition to the rich-combustion operation, however, the target air-fuel ratio λ in equation (1) is also reset from a large value (e.g., 22) fit for the lean-combustion operation to a small value (e.g., 14.7) fit for the rich-combustion operation. As a result, even during the transition to the rich-combustion operation in which the suction air amount A/N is rapidly reduced, the fuel supply amount is reduced less rapidly than the fuel supply amount for the lean-combustion operation. To be exact, the fuel supply amount is kept substantially constant while the operation mode is switched from the lean-combustion operation to the rich-combustion operation. Thus, the air-fuel ratio can be changed from a large value on the fuel-lean side to a small value approximate to the theoretical air-fuel ratio without changing the engine output, in order to switch the operation mode from the lean-combustion operation to the rich-combustion operation.

Immediately after the transition from the rich-combustion operation to the lean-combustion operation, on the other hand, the suction air amount A/N increases rapidly. However, the value of the air-fuel ratio λ in equation (1), which is used to compute the valve-open period Tinj, is changed from a small value for rich combustion to a large value for lean combustion immediately after the transition to the lean-combustion operation. Thus, the fuel supply amount can be kept substantially at the same value as that for the rich-combustion operation, so that the operation mode can be switched to the lean-combustion operation without changing the engine output. In consequence, the engine output can be prevented from rapidly changing during the air-fuel ratio change.

In connection with the features described above the target suction air amount $A/N_L$, read from the map in Step S16 to be used for the suction air amount control for the air-fuel ratio control, represents a necessary air amount for obtaining the same torque by lean combustion as an engine torque produced by rich combustion with the throttle valve opening θ provided when a driver steps on the accelerator pedal. In other words, the air-fuel ratio control according to the present embodiment is such that only the air amount is increased without substantially changing the amount of the fuel supplied to the engine E, whereby the combustion mode is changed from rich combustion to lean combustion. By doing this, a torque shock can be prevented from being produced in the engine during the change.

The following is a description of an air-fuel ratio control apparatus according to a second embodiment of the present invention.

The air-fuel ratio control apparatus of the present embodiment differs from the foregoing first embodiment, which is arranged so that the amount of the suction air supplied through the main and sub-bypass lines 43 and 31 during the lean-combustion operation is feedback-controlled for the target value, in that the valve opening of the ISC valve 30 and hence the suction air amount are subjected to open-loop control during the lean-combustion operation.

As mentioned before with reference to FIG. 6, it is difficult always to proportion the throttle valve opening and the ACV opening (valve opening of the negative-pressure responsive valve 41) to each other throughout the area of the throttle valve opening. As the throttle valve opening increases, the actual ACV opening indicated by the full line in FIG. 6 becomes smaller than the optimum ACV opening indicated by the broken line in FIG. 6. In the present embodiment, therefore, the valve opening of the ISC valve 30 is open-loop-controlled in order to make up for this deficiency in the ACV opening. To attain this, a series of target openings for the ISC valve 30 fit for various combinations of, e.g., the engine speed and the throttle valve opening are obtained, for example, experimentally in advance, and are stored in the form of a map in the storage device of the ECU 23, which constitutes part of the air-fuel ratio control apparatus.

Figure 8:
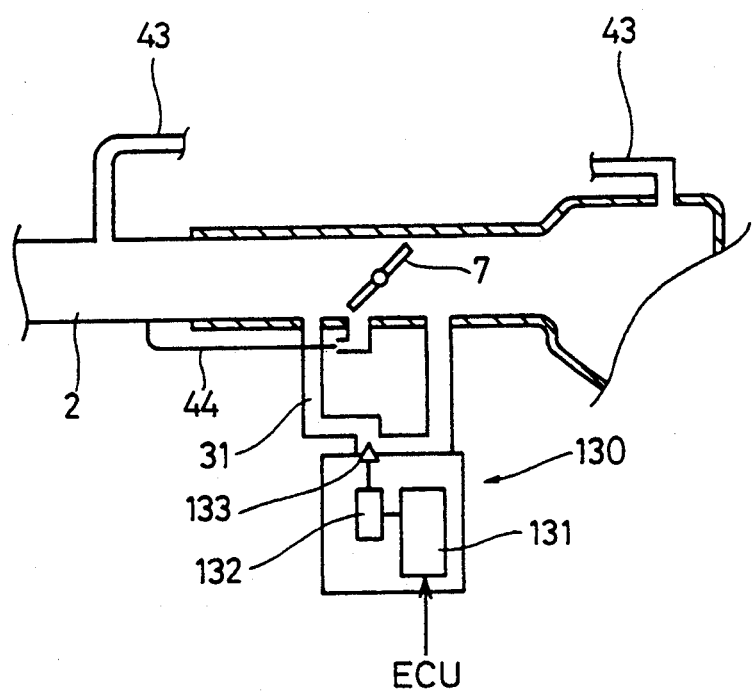
FIG. 8 is a partial schematic view showing a motor-operated valve provided in a sub-bypass line of the apparatus of the second embodiment.

The air-fuel ratio control apparatus of the present embodiment differs from the apparatus of the foregoing first embodiment, which is provided with the ISC valve 30 formed of a solenoid valve, in that the air-fuel ratio control apparatus of the present embodiment includes a motor-operated ISC valve 130 (FIG. 8) having a stepping motor 131, which operates under the control of the ECU 23, and a valve plug 133, which is connected to the output shaft of the motor by means of a worm gear 132, and whose lift varies as the motor output shaft rotates.

Figure 2:
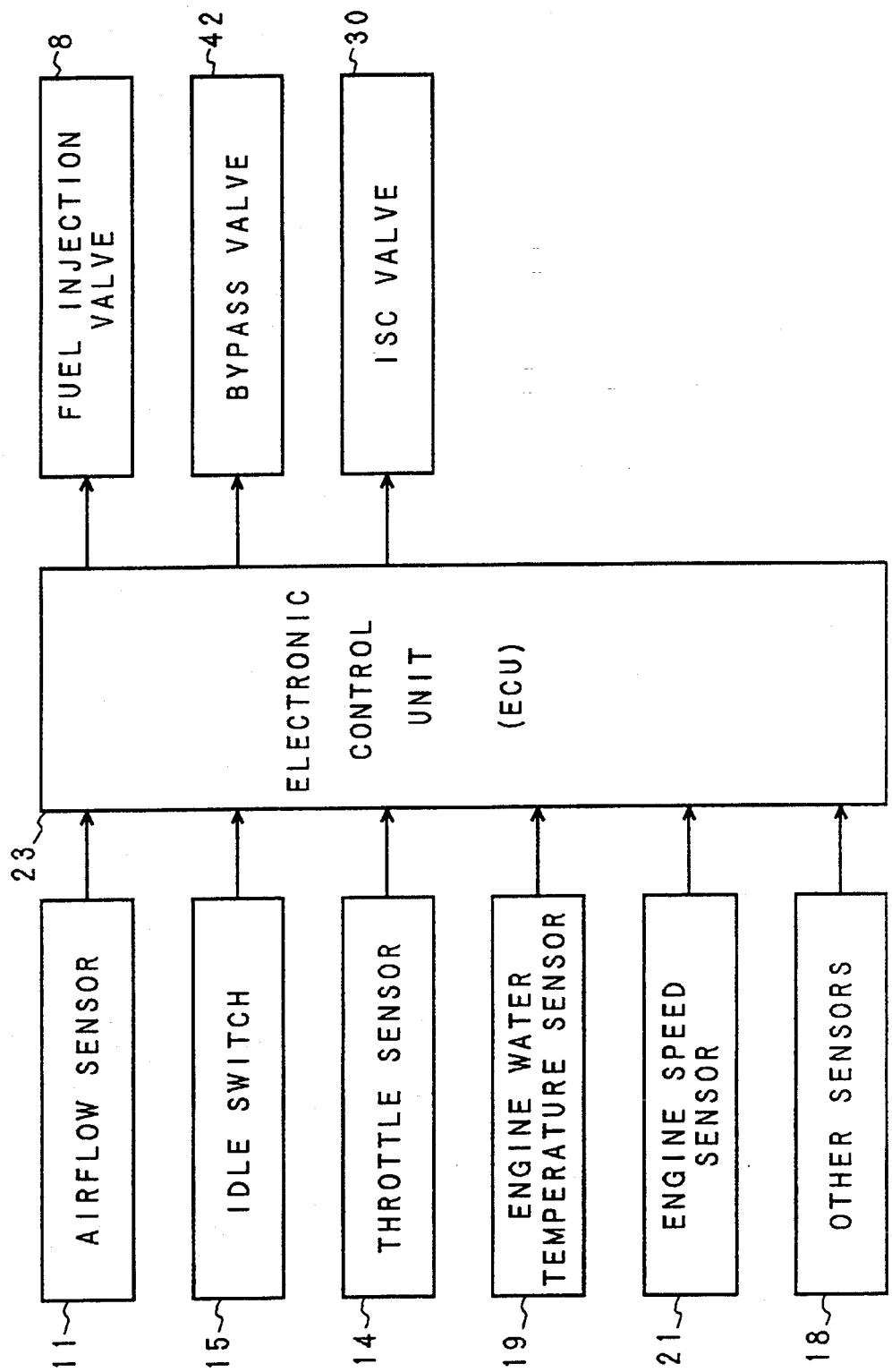
FIG. 2 is a block diagram showing an electronic control system of the air-fuel ratio control apparatus shown in FIG. 1.

For other arrangements, the air-fuel ratio control apparatus of the present embodiment, like the apparatus of the first embodiment, can be arranged in the manner shown in FIGS. 1 and 2. Also, the apparatus of the present embodiment can be used with the engine E of the construction shown in FIG. 1. Accordingly, a description of the construction of the apparatus according to the present embodiment is partially omitted.

Figure 7:
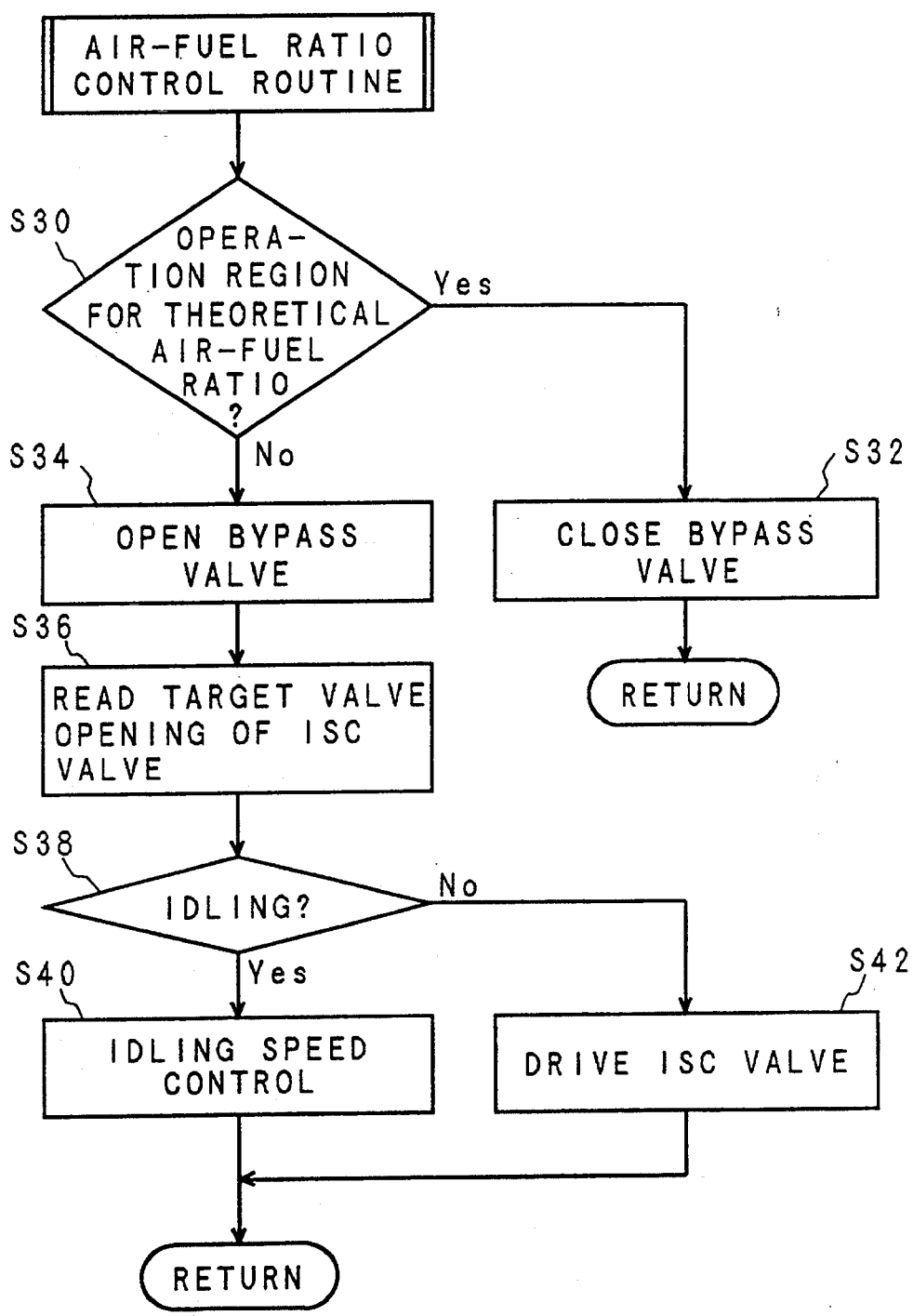
FIG. 7 is a flow chart showing an air-fuel ratio control routine of an air-fuel ratio control apparatus according to a second embodiment of the present invention.

Referring now to FIG. 7, an air-fuel ratio control routine according to the second embodiment will be described.

Steps S30, S32, S34, S38, S40 and S42 of FIG. 7 according to the second embodiment are identical, respectively, with Steps S10, S12, S14, S24, S26 and S28 of FIGS. 3 and 4 according to the first embodiment, so that a description of these steps common to the two embodiments is partially omitted.

In each cycle of the air-fuel ratio control routine periodically executed by means of the CPU, if the CPU of the ECU 23 concludes in Step S30 that the engine E is being operated in the region for the theoretical air-fuel ratio operation on the basis of the change of signals from the throttle sensor 7, the CPU stops the supply of the driving signal to the solenoid 42c of the bypass valve 42 (Step S34), thereby stopping the air supply to the engine E through the bypass line 43, whereupon the air-fuel ratio control routine for the present cycle is finished. Thus, the suction air in the amount corresponding to the throttle valve opening and the fuel in the amount computed according to equation (1) are supplied to the engine E, whereby the rich-combustion operation is performed with use of the theoretical air-fuel ratio.

If it is concluded in Step S30 that the engine E is being operated in the lean-combustion operation region, on the other hand, the CPU supplies the driving signal to the solenoid 42c of the bypass valve 42 (Step S34). As a result, the negative pressure inside the suction passage 2 is supplied to the pressure chamber 41c of the negative-pressure responsive valve 41, thereby opening the negative-pressure responsive valve 41, whereby the bypass air is supplied to the engine E through the bypass line 43.

Then, based on the throttle valve opening $\theta$ detected by means of the throttle sensor 14 and the engine speed Ne detected by means of the engine speed sensor 21, the CPU reads a target valve opening of the ISC valve 130 for the lean-combustion operation, which is fit for the respective values of the parameters $\theta$ and Ne, from the map in the storage device (Step S36).

If it is then concluded in Step S38 that the engine E is not in the idling state, the CPU controls the rotational position of the output shaft of the stepping motor 131 of the ISC valve 130 so that the valve opening of the ISC valve 130 (not shown) is adjusted to the target valve opening (Step S42). As a result, the suction air in an amount corresponding to the difference between a necessary suction air amount for attaining the target air-fuel ratio for the lean-combustion operation and the amount of the suction air supplied through the main bypass line 43, that is, a deficiency in the suction air amount, is supplied to the engine E through the sub-bypass line 31.

During the lean-combustion operation, as described above, the bypass valve 42 is opened in Step S34, and the ISC valve 130 is open-loop-controlled so that its valve opening is adjusted to the target opening. Specifically, the valve opening of the ISC valve 130 is open-loop-controlled so that the ratio between a throttle valve opening area (suction passage opening area determined by the throttle valve opening) and the sum of the respective opening areas of the main and sub-bypass lines 43 and 31 is equal to the ratio between the theoretical air-fuel ratio (first air-fuel ratio) and the target air-fuel ratio (second air-fuel ratio) on the fuel-lean side of the theoretical air-fuel ratio. In consequence, the amount of the suction air supplied through the bypass lines 43 and 31 is adjusted, so that the lean-combustion operation is effected with use of the predetermined air-fuel ratio $\lambda_L$ on the lean side with respect to the theoretical air-fuel ratio.

If it is concluded in Step S38 that the engine E is in the idling state, on the other hand, the conventional idling speed control is executed (Step S40).

The present invention is not limited to the first and second embodiments described above, and various modifications may be effected therein.

Although the duty-controlled solenoid valve is used as the ISC valve 30 in the first embodiment, for example, the pulse-motor-operated ISC valve 130 used in the second embodiment may be used instead.

Although the target air-fuel ratio $\lambda_L$ common to the whole lean-combustion operation region is used in the first embodiment, moreover, the target air-fuel ratio $\lambda_L$ may be variably set depending on the operating state of the engine E. For example, the target air-fuel ratio $\lambda_L$ may be variably set depending on the combination of the suction air amount A/N and the engine speed Ne, which are indicative of the engine operating state. In other words, the whole lean-combustion operation region may be divided into a number of small regions in accordance with the parameters A/N and Ne so that different target air-fuel ratios $\lambda_L$ are applied individually to the different small regions. In this case, a series of target air-fuel ratios (the second air-fuel ratios) $\lambda_L$ adjusted individually to values greater than or on the lean side of the theoretical air-fuel ratio $\lambda_S$ so as to be fit for various combinations of the suction air amount A/N and the engine speed Ne, individually, are previously stored in the form of a map in the built-in storage device of the ECU 23, and the target air-fuel ratio $\lambda_L$ fit for the respective actual values of the parameters A/N and Ne is read from the map in the storage device in accordance with the two parameter values during the engine operation.

In the aforementioned modification in which the target air-fuel ratio $\lambda_L$ is variably set depending on the engine operating state, in contrast with the ease of the foregoing first embodiment in which the target air amount $A/N_L$ is read from the map, the target air amount $A/N_L$ is set by reading the suction air amount $A/N_S$ and the target air-fuel ratio $\lambda_L$ for the rich-combustion operation from the map in accordance with the throttle valve opening $\theta$ and the engine speed Ne, and computing the target suction air amount $A/N_L$ according to the following equation and with use of the target air-fuel ratio $\lambda_S$ for the rich-combustion operation.

$$A/N_L = (A/N_S) \div \lambda_S \times \lambda_L.$$

According to the foregoing first embodiment, moreover, the opening correction value $\Delta P_{ISC}$ of the ISC valve 30 is computed according to equation (2), that is, by multiplying the deviation $\Delta A/N$ between the target suction air amount and the actual suction air amount by the feedback proportional gain. However, the method for computing the ISC valve opening correction value is not limited to this, and various PID control methods may be used instead.

In the foregoing first embodiment, the air-fuel ratio $\lambda_S$ for the rich-combustion operation is changed at once to the air-fuel ratio $\lambda_L$ for the lean-combustion operation. If the increase of the air amount by means of the negative-pressure responsive valve 41 is subject to a delay, however, the air-fuel ratio may be gradually changed in accordance with the delay of the increase of the air amount.

When using an air-fuel ratio linear sensor, moreover, it is necessary only that the target value of the air-fuel ratio be changed.

According to the first embodiment in which the suction air amount is feedback-controlled, it is not essential to select a position such that the ACV negative pressure changes substantially in proportion to the throttle valve opening as the position where that end of the line 44 which opens into the suction passage 2 is formed.

It is to be understood that the present invention may be applied to a system in which a negative pressure sensor is used to detect the negative pressure on the lower-course side of the throttle valve, in place of the system in which the airflow sensor is used for the fuel supply control.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. In an air-fuel ratio control apparatus of an internal combustion engine, which controls the air-fuel ratio of an air-fuel mixture to be supplied to an engine so that the air-fuel ratio is adjusted to a first air-fuel ratio approximate to a theoretical air-fuel ratio when said engine is in a specific operating state, and that the air-fuel ratio is adjusted to a second air-fuel ratio on the fuel-lean side of said first air-fuel ratio when said engine is in any other operating state than said specific operating state, an air-fuel ratio control apparatus of an internal combustion engine, comprising:

a main bypass line bypassing a throttle valve in the middle of a suction passage of said engine and having both ends thereof communicated with said suction passage;

a sub-bypass line bypassing said throttle valve and having both ends thereof communicated with said suction passage;

main valve means for adjusting the amount of air sucked in through said main bypass line;

sub-valve means for adjusting the amount of air sucked in through said sub-bypass line;

fuel supply means for adjusting the amount of a fuel to be supplied to said engine; and control means adapted to control the drive of said main valve means, said sub-valve means and said fuel supply means;

wherein said control means controls the drive of said main valve means so that the suction air supply through said main bypass line is prevented when said engine is in said specific operating state, and controls the amount of the fuel supplied from said fuel supply means in dependence on the amount of the suction air supplied through said suction passage not including at least said main bypass line, so that said first air-fuel ratio is attained, when said engine is in said specific operating state;

wherein said control means controls the drive of said main valve means and said sub-valve means such that said main bypass line and said sub-bypass line are open when said engine is in any other operating state than said specific operating state, and controls the amount of the fuel supplied from said fuel supply means in dependence on the amount of the suction air supplied through said suction passage including said main and sub-bypass lines, so that said second air-fuel ratio is attained, when said engine is in any other operating state than said specific operating state; and wherein the drive of said main valve means and said sub-valve means is controlled by said control means while the operation mode is switched from operation with said first air-fuel ratio to operation with said second air-fuel ratio such that said suction air amount is changed so as to reduce a difference between outputs capable of being practically fetched from said engine before and after the operation mode switching.

2. An air-fuel ratio control apparatus of an internal combustion engine according to claim 1, wherein said main valve means is formed of a negative-pressure responsive valve adapted to operate in response to a negative pressure inside the suction passage varying depending on the opening of the throttle valve, and said control means prevents the negative pressure supply to said negative-pressure responsive valve when said engine is in said specific operating state, and allows the negative pressure supply to said negative-pressure responsive valve when said engine is in any other operating state than said specific operating state.

3. An air-fuel ratio control apparatus of an internal combustion engine according to claim 1, wherein said negative-pressure responsive valve includes a negative pressure chamber and a valve plug disposed in said main bypass line and having a lift varying depending on the negative pressure supplied to said negative pressure chamber; said main valve means further includes a line, having one end thereof communicated with said suction passage just on the upper-course side of said throttle valve and the other end thereof communicated with said negative pressure chamber of said negative-pressure responsive valve, and a bypass valve in the middle of said line; and said control means drives said bypass valve so as to allow the supply of the negative pressure from said suction passage to said negative pressure chamber through said line when said engine is in any other operating state than said specific operating state, and drives said bypass valve so as to prevent the negative pressure supply when said engine is in said specific operating state.

4. An air-fuel ratio control apparatus of an internal combustion engine according to claim 2, wherein said sub-valve means is formed of a solenoid-operated on-off valve, and said control means controls an on- off duty ratio corresponding to the time-based average valve opening of said solenoid-operated on-off valve.

5. An air-fuel ratio control apparatus of an internal combustion engine according to claim 2, wherein said sub-valve means is formed of a motor-operated valve including a stepping motor and having a valve opening corresponding to the rotational position of the motor, and said control means controls the rotational position of said stepping motor.

6. An air-fuel ratio control apparatus of an internal combustion engine according to claim 1, which further comprises load parameter detecting means for detecting the value of a parameter indicative of a load acting on said engine, and wherein said control means subjects the valve opening of said sub-valve means to open-loop control in accordance with the engine load.

7. An air-fuel ratio control apparatus of an internal combustion engine according to claim 1, which further comprises load parameter detecting means for detecting the value of a parameter indicative of a load acting on said engine and air amount detecting means for detecting the amount of air sucked in through said suction passage, and wherein said control means computes a target suction air amount such that said second air-fuel ratio can be attained, in accordance with the detected engine load parameter value, when said engine is in any other operating state than said specific operating state, and then subjects the valve opening of said sub-valve means to feedback control in accordance with the difference between the detected actual suction air amount and said target suction air amount.

8. An air-fuel ratio control apparatus of an internal combustion engine according to claim 7, wherein said load parameter detecting means is throttle opening detecting means for detecting the throttle opening, and said control means computes said target suction air amount in accordance with the detected throttle valve opening.

9. An air-fuel ratio control apparatus of an internal combustion engine according to claim 1, which further comprises idling detecting means for determining whether or not said engine is idling; and wherein said control means received a result of detection by said idling detecting means, and controls the drive of said sub-valve means on the basis of a result of comparison between the speed of said engine and a target speed so that the engine speed is equal to said target speed during the idling operation of said engine, and controls the drive of said sub-valve means in order to change said suction air amount, assisting said main valve means, during the change between said specific operating state and any other operating state, when said engine is not idling.

10. An air-fuel ratio control apparatus of an internal combustion engine according to claim 9, wherein said main valve means is formed of a negative-pressure responsive valve adapted to operate in response to a negative pressure inside the suction passage varying depending on the opening of the throttle valve, and said control means prevents the negative pressure supply to said negative-pressure responsive valve when said engine is in said specific operating state, and allows the negative pressure supply to said negative-pressure responsive valve when said engine is in any other operating state than said specific operating state.

11. An air-fuel ratio control apparatus of an internal combustion engine according to claim 10, wherein said negative-pressure responsive valve includes a negative pressure chamber and a valve plug disposed in said main bypass line and having a lift varying depending on the negative pressure supplied to said negative pressure chamber; said main valve means further includes a line, having one end thereof communicated with said suction passage just on the upper-course side of said throttle valve and the other end thereof communicated with said negative pressure chamber of said negative-pressure responsive valve, and a bypass valve in the middle of said line; and said control means drives said bypass valve so as to allow the supply of the negative pressure from said suction passage to said negative pressure chamber through said line when said engine is in any other operating state than said specific operating state, and drives said bypass valve so as to prevent the negative pressure supply when said engine is in said specific operating state.

* * * * *